(12) United States Patent
Rashev et al.

(10) Patent No.: US 8,498,590 B1
(45) Date of Patent: Jul. 30, 2013

(54) SIGNAL TRANSMITTER LINEARIZATION

(75) Inventors: Peter Zahariev Rashev, Calgary (CA); David M. Tholl, Calgary (CA); Kenneth Minderhoud, Airdrie (CA)

(73) Assignee: Apple Inc., Cupertino, CA (US)

( * ) Notice: Subject to any disclaimer, the term of this patent is extended or adjusted under 35 U.S.C. 154(b) by 566 days.

(21) Appl. No.: 11/694,794

(22) Filed: Mar. 30, 2007

Related U.S. Application Data

(60) Provisional application No. 60/788,998, filed on Apr. 4, 2006.

(51) Int. Cl.
  *H04B 1/04* (2006.01)
  *H01Q 11/04* (2006.01)
(52) U.S. Cl.
  USPC ............ 455/114.2; 455/114.3; 455/126; 455/127.2; 375/296
(58) Field of Classification Search
  USPC ........... 455/114.2–115.1, 126, 127.1–127.2, 455/425, 424, 456.5, 456.6, 561, 550, 1, 455/575.1, 501, 522, 63.1, 570, 114.3; 375/295–297, 135, 146, 267; 330/291, 296, 330/129, 130, 131, 132, 149, 275, 285, 136, 330/289
  See application file for complete search history.

(56) References Cited

U.S. PATENT DOCUMENTS

| | | | |
|---|---|---|---|
| 4,577,334 A | 3/1986 | Boer et al. | |
| 4,717,894 A | 1/1988 | Edwards et al. | |
| 4,870,698 A * | 9/1989 | Katsuyama et al. | 455/522 |
| 5,049,832 A | 9/1991 | Cavers | |
| 5,113,414 A | 5/1992 | Karam et al. | |
| 5,119,399 A | 6/1992 | Santos et al. | |
| 5,278,992 A * | 1/1994 | Su et al. | 455/69 |
| 5,297,161 A * | 3/1994 | Ling | 375/130 |
| 5,371,481 A | 12/1994 | Tiittanen et al. | |
| 5,524,285 A | 6/1996 | Wray et al. | |
| 5,613,226 A | 3/1997 | Kanami | |
| 5,655,220 A * | 8/1997 | Weiland et al. | 455/69 |
| 5,732,333 A | 3/1998 | Cox et al. | |
| 5,740,520 A | 4/1998 | Cyze et al. | |
| 5,786,728 A | 7/1998 | Alinikula | |
| 5,877,653 A * | 3/1999 | Kim et al. | 330/149 |
| 5,990,738 A | 11/1999 | Wright et al. | |
| 6,133,789 A | 10/2000 | Braithwaite | |
| 6,147,553 A | 11/2000 | Kolanek | |
| 6,169,463 B1 | 1/2001 | Mohindra et al. | |
| 6,194,964 B1 | 2/2001 | Jun | |
| 6,208,698 B1 | 3/2001 | Marchesani et al. | |
| 6,266,517 B1 | 7/2001 | Fitzpatrick et al. | |
| 6,275,685 B1 * | 8/2001 | Wessel et al. | 455/126 |

(Continued)

OTHER PUBLICATIONS

Faulkner, M., et al., "Amplifier Linearisation Using RF Feedback and Feedforward Techniques", *Proceedings of the IEEE Vehicular Technology Conference*, Chicago, IL,(Jul. 25, 1995),525-529.

(Continued)

*Primary Examiner* — Simon Nguyen
(74) *Attorney, Agent, or Firm* — Meyertons, Hood, Kivlin, Kowert & Goetzel, P.C.

(57) ABSTRACT

A linearizer for a non-linear transmitter and method include a gain regulator and predistorter adapted to be coupled to a non-linear transmitter in various configurations. Bounding controllers are coupled to the gain regulator and predistorter to maintain normal operation of a transmit path to prevent unstable transmitter operation.

20 Claims, 2 Drawing Sheets

U.S. PATENT DOCUMENTS

| | | | |
|---|---|---|---|
| 6,298,096 | B1 | 10/2001 | Burgin |
| 6,356,146 | B1* | 3/2002 | Wright et al. ............... 330/2 |
| 6,600,792 | B2* | 7/2003 | Antonio et al. ............ 375/297 |
| 6,985,033 | B1* | 1/2006 | Shirali et al. ............. 330/149 |
| 7,009,453 | B2* | 3/2006 | Kuriyama ................ 330/289 |
| 7,085,330 | B1* | 8/2006 | Shirali ..................... 375/296 |
| 7,151,405 | B2* | 12/2006 | Nezami .................... 330/149 |
| 7,333,557 | B2* | 2/2008 | Rashev et al. ............. 375/296 |
| 7,340,005 | B2* | 3/2008 | Kim et al. ................. 375/296 |
| 7,400,202 | B2* | 7/2008 | Yamamoto et al. ........ 330/296 |
| 7,514,966 | B2* | 4/2009 | Ho ............................. 327/66 |
| 8,326,238 | B2* | 12/2012 | Yang et al. .............. 455/114.3 |
| 2001/0022532 | A1 | 9/2001 | Dolman |
| 2002/0048326 | A1* | 4/2002 | Sahlman ................... 375/297 |
| 2002/0085647 | A1* | 7/2002 | Oishi et al. ............... 375/297 |
| 2002/0101937 | A1* | 8/2002 | Antonio et al. ........... 375/297 |
| 2002/0181611 | A1 | 12/2002 | Kim |
| 2002/0191710 | A1* | 12/2002 | Jeckeln et al. ............ 375/296 |
| 2003/0146791 | A1 | 8/2003 | Shvarts et al. |
| 2003/0199257 | A1* | 10/2003 | Wilkinson et al. ........ 455/127.1 |
| 2003/0227342 | A1* | 12/2003 | Liu ............................ 332/145 |
| 2004/0116083 | A1* | 6/2004 | Suzuki et al. ............. 455/126 |
| 2004/0179629 | A1* | 9/2004 | Song et al. ................ 375/296 |
| 2004/0198268 | A1* | 10/2004 | Rashev et al. ............ 455/126 |
| 2004/0251967 | A1* | 12/2004 | Moriwaki et al. ......... 330/296 |
| 2005/0047521 | A1* | 3/2005 | Ishikawa et al. .......... 375/296 |
| 2005/0163250 | A1* | 7/2005 | McCallister ............... 375/296 |
| 2006/0003787 | A1* | 1/2006 | Heo et al. .................. 455/522 |
| 2006/0023807 | A1* | 2/2006 | Shako et al. .............. 375/296 |
| 2006/0098758 | A1* | 5/2006 | Luke et al. ................ 375/297 |
| 2007/0014381 | A1* | 1/2007 | Rozenblit et al. ......... 375/297 |
| 2007/0190952 | A1* | 8/2007 | Waheed et al. ........... 455/114.3 |

OTHER PUBLICATIONS

Jones, A. E., et al., "Phase error correcting vector modulator for personal communications network(PCN) transceivers", *Electronics Letters*, 27(14), (Jul. 4, 1991),1230-1231.

Lohtia, A., et al., "Power Amplifier Linearization Using Cubic Spline Interpolation", *IEEE Vehicular Technology Conference*, (May 18-20, 1993),676-679.

Sano, A., et al., "Identification of Hammerstein-Wiener System with Application to Compensation for Nonlinear Distortion", *SICE 2002; Proceedings of the 41st SICE Annual Conference*; vol. 3, (Aug. 5-7, 2002),1521-1526.

* cited by examiner

SIGNAL TRANSMITTER LINEARIZATION

RELATED APPLICATION

This application claims the benefit under 35 U.S.C. 119(e) of U.S. Provisional Application Ser. No. 60/788,998 (entitled System for Robust Linearization of Transmitter Feedback, filed Apr. 4, 2006) which is incorporated herein by reference.

BACKGROUND

Radio transmitters amplify input signals. It is desired that the gain of such transmitters be linear for the entire range of input signals. A common architecture of recently proposed baseband power amplifier linearizers includes a digital nonlinear gain block, usually called a predistortion block, inserted in the transmitter chain prior to upconversion stages. The predistortion block may be continuously adapted to approximate as closely as possible the inverse nonlinear complex gain of the following transmitter stages up to the power amplifier. Feedback may be provided to the predistortion block. However, such feedback may result in unstable transmitter operation. There is need to stabilize operation of the radio transmitter while accounting for nonlinearities of power amplifiers.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein are implemented in software or a combination of software and human implemented procedures in one embodiment. The software may consist of computer executable instructions stored on computer readable media such as memory or other type of storage devices. The term "computer readable media" is also used to represent any means by which the computer readable instructions may be received by the computer, such as by different forms of wireless transmissions. Further, such functions correspond to modules, which are software, hardware, firmware or any combination thereof. Multiple functions are performed in one or more modules as desired, and the embodiments described are merely examples. The software may be executed on a FPGA, ASIC, digital signal processor, microprocessor, or other type of processor operating on a computer system, such as a personal computer, server or other computer system.

Multiple embodiments are described which may increase the robustness of linearization of signal transmitters with feedback. The embodiments protect a transmitter linearized by adaptive closed-loop controllers. Various embodiments are described which may prevent unstable transmitter operation including saturation in cases when (1) the feedback signal is nonexistent, (2) there is insufficient correlation between the transmitted and received signals (e.g. because of, but not limited to, errors in the transmitter modulation/up-conversion or in the feedback receiver down-conversion/demodulation), (3) there is saturation or number overflow in the transmitted signal, or (4) there is saturation or number overflow in the feedback signal.

Figure 1:
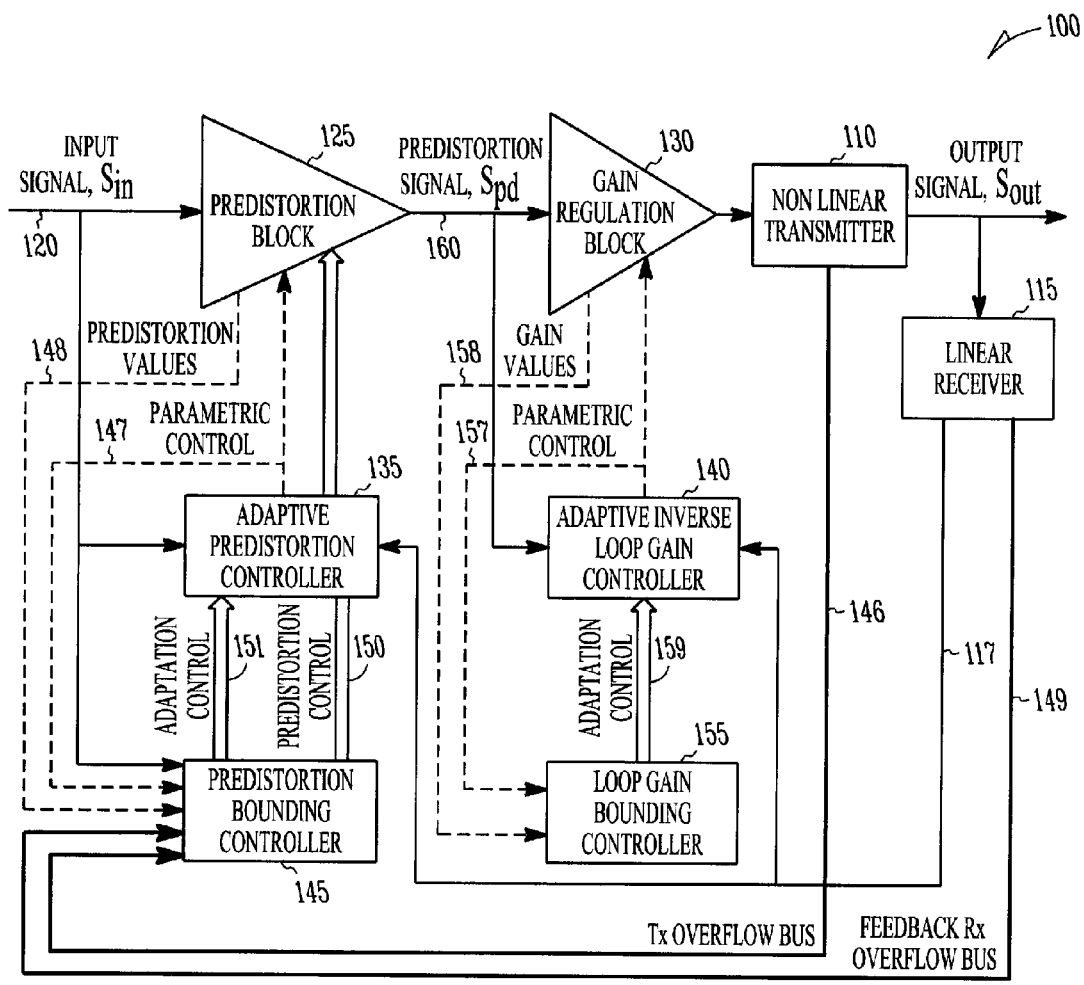
FIG. 1 is a block diagram of a transmitter with linearization according to an example embodiment.

Contemporary baseband techniques for linearization of radio transmitters, and in particular of power amplifiers, employ closed-loop transceiver systems 100 composed of two branches: forward—encompassing a nonlinear transmitter 110 (including an amplifier), and feedback—realized by a linear receiver 115 with each propagating respectively the input and the output signals of the transmitter as seen in FIG. 1. The feedback branch may include the linear receiver 115 with feedback output 117 responsible for demodulating the transmitted signal to the format of the input signal 120. Prior to transmission, the input signal is subjected to nonlinear complex-number amplification in a predistortion functional block, referred to as predistorter 125. Compensation of the linear variations in the adaptive loop is achieved using a gain regulation functional block, referred to as gain regulator 130, that performs additional scaling of (1) of the predistorted signal 160 before entering the transmitter 110 as seen in FIG. 1, or, (2) the signal in the feedback branch of the adaptive loop as seen in the alternate system depicted in FIG. 2. The gain regulator 130 is thus adapted to be coupled either directly to the non-linear transmitter 110, or indirectly through the feedback signal 117.

The predistortion block 125 may be controlled by an adaptive predistortion controller 135, which is responsible for the estimation of the nonlinearity present in the adaptive loop as a function of feedback 117. The gain regulation block may be controlled by an adaptive controller 140 responsible for the estimation of the inverse linear gain of a section of the adaptive loop located between the output of the predistortion block 125 and the output of the feedback branch including receiver 115.

The adaptive predistortion controller 135 and predistortion block 125 are supervised by a predistortion bounding controller 145 which monitors one or more of the following groups of signals at its input: (1) the power level of the input signal 120 which is related to a Parametric Control output 147 of the predistortion controller 135, (2) the Parametric Control output 147 of the predistortion controller 135 which provides updates to the predistortion values of the predistortion block 125, (3) the actual Predistortion Values 148 used by the predistortion block 125, (4) a bus 146 of flags indicating saturation or overflow of the predistorted signal in the transmitter 110, and (5) a bus 149 of flags indicating saturation or overflow of the output signal in the feedback receiver 115.

The predistortion bounding controller 145 outputs control signals, such as predistortion control signals 150 to the predistortion block 125 via the controller 135 which can: (1) limit the dynamic range of the applied predistortion values, (2) limit the range of input signals subjected to predistortion, (3) extrapolate predistortion values for use at previously unobserved or unexpected dynamic range of input signal or (4) modify the predistortion values as a function of present and past values in a moving average sense in order to reduce random variations. It also provides adaptation control signals 151 which can modify the adaptive predistortion processes of controller 135 in terms of: (1) limiting the amount by which the predistortion values are updated/changed, (2) limiting the range of predistorter values to be updated, or (3) modifying the amount of predistortion values update as a function of present and past values or update amounts in a moving average sense in order to reduce random or fast variations. As extreme measures the predistortion bounding controller can stop the adaptive process or reset the predistortion values to their initial state or a more suitable state estimated during recent normal operation.

Figure 2:
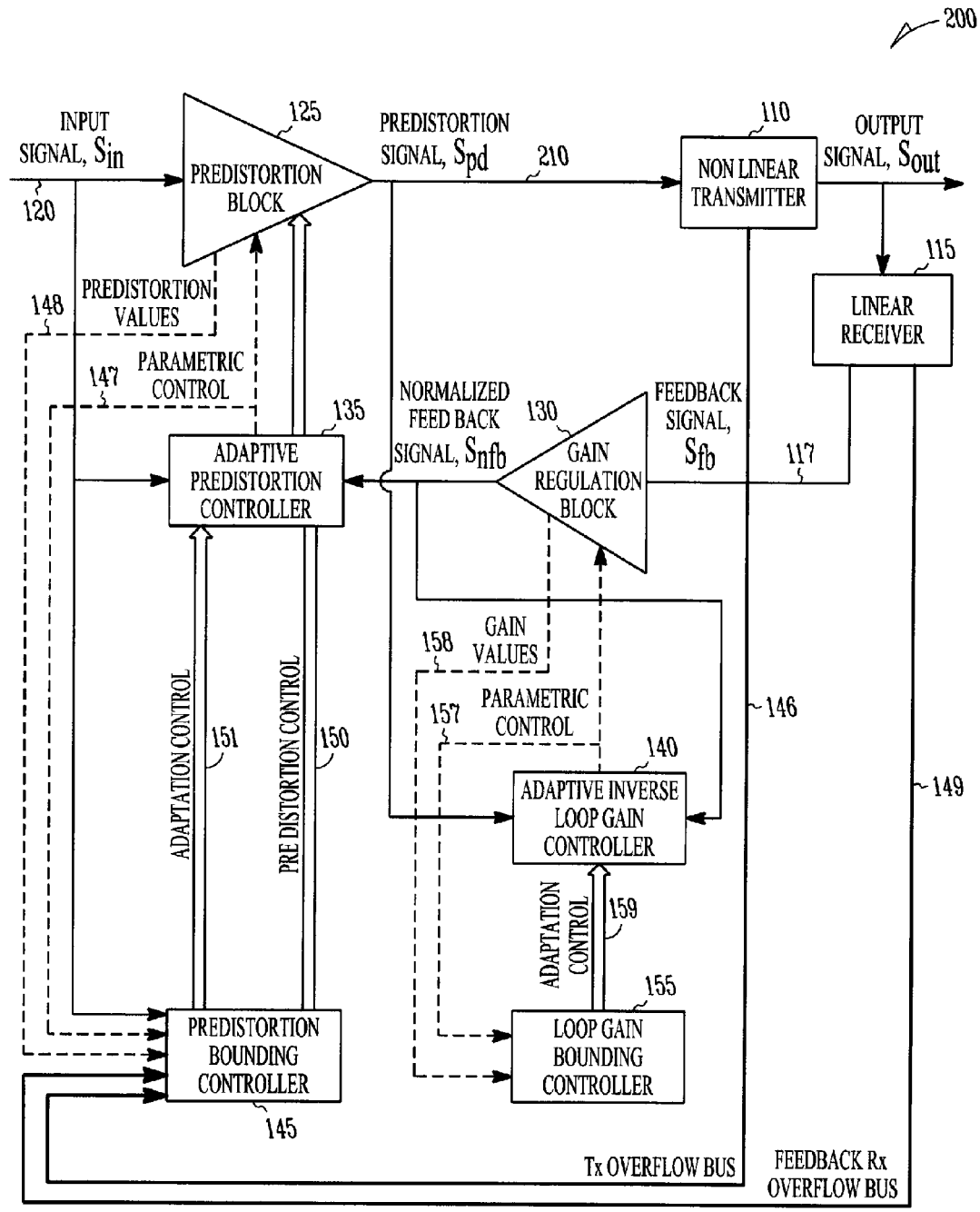
FIG. 2 is a block diagram of an alternative transmitter with linearization according to an example embodiment.

The adaptive loop-gain controller 140 and gain regulation block 130 are supervised by a loop-gain bounding controller 155 which monitors a Parametric Control output 157 of the loop gain controller updating the gain regulation values, as well as the actual gain regulation values 158 applied to the predistorted signal 160 in FIG. 1 and feedback signal 117 in FIG. 2. The loop-gain bounding controller 155 outputs control signals to: the gain regulation block 130 which can limit the dynamic range of its values, as well as to the loop-gain regulation controller 140 via an adaptation control line 159 which can limit the amount of gain value update/change. It is capable of stopping the gain regulation process in cases of excess gains applied to transmit path and resetting the gain block to initial or more suitable values estimated during recent normal operation.

Combinations of systems 100 and 200 may also be formed in alternative embodiments, such as the existences of both transmit and feedback gain regulation blocks with their corresponding controllers. In some embodiments, while the transmitter path is in a protection mode, i.e. its gain regulation block is not adapting because of an action by the bounding controller, the feedback gain block can continue to monitor the closed-loop. If it reaches saturation or overflow limits it can be reset by the supervising bounding controller to continue until the adverse loop conditions are removed and normal operation of the transmit path is guaranteed.

For each embodiment of the system the loop gain bounding controller 155 has set of possible behaviors. Examples include, (1) for system 100, the loop gain bounding controller 155 could instruct the adaptive inverse loop gain controller 140 to search for a stable value, in a restricted safe operating range, resulting in the variations due to the search being observable in the output signal, (2) for system 200, the loop gain bounding controller 155 could stop adaptation of the system such that only a momentarily observable error was present in the output signal while the adaptive loop gain controller 140 continued the search for a stable inverse gain between the input signal 120 and feedback signal 117, (3) in alternative embodiments utilizing a combination of the example systems shown other, perhaps more desirable, behaviors are possible for example eliminating any momentarily observable output error.

Various embodiments described may exhibit one or more advantages over prior systems, such as a non-catastrophic response to abrupt loss of feedback signal integrity or quality allowing fast system response and eventual automated recovery. Fast transmitter protection from excess signal levels may also be provided. A robust linearization process has reduced sensitivity to feedback signal saturation or overflow, which may violate a requirement for feedback linearity. A robust linearization process has reduced sensitivity to transmit signal saturation or overflow, which create unmanageable non-linear components.

While preserving the main properties of selected previous predistortion methods related to adaptive linearizers, various embodiments may provide a distinction between the nonlinear and the linear transmitter impairments leading to efficient cancellation of the latter. Extraction of the nonlinear component of the transmitter gain and its inverse in terms of a normalized predistortion gain (of zero mean phase and unity average magnitude) allows separate management of the linearization process from the transmitter (bulk) power gain and average phase rotation.

The robust adaptive control system described herein may be applied to improve the reliability of signal transmitters in different fields such as, but not limited to, RF transmission, Hi-Fi audio, Hi-Fi video, optical transmission and, generally, in systems where high-quality of electrical/electro-mechanical/electro-optical/electro-magnetic signal transformation is desired.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A linearizer for a non-linear transmitter, the linearizer comprising:
   a feedback receiver;
   a gain regulator continuously adapted to be coupled to a non-linear transmitter;
   an adaptive loop gain controller coupled to the gain regulator;
   a loop gain bounding controller that receives feedback from a non-linear transmitter output and is coupled to control the gain regulator;
   a continuously adaptive predistorter to apply complex-number amplification to provide a predistortion signal using continuously adapted predistortion values as a function of the feedback for the non-linear transmitter;
   an adaptive predistorter controller to estimate the nonlinearity present in the adaptive loop and control the predistorter; and
   a predistortion bounding controller coupled to receive signals from the non-linear transmitter and separately coupled to receive signals from the feedback receiver to prevent unstable transmitter operation by providing predistortion control signals to provide limits on the predistorter and providing adaption control signals to the adaptive predistorter controller to modify updating of the predistortion values, wherein at least one of the signals from the non-linear transmitter or the signals from the feedback receiver comprise a flag indicating saturation or overflow of an input to the non-linear transmitter or the feedback receiver, respectively.

2. The linearizer of claim 1 wherein the loop gain bounding controller limits a dynamic range of gain values for the gain regulator, the adaptive loop gain controller having a parametric output updating gain regulation values.

3. The linearizer of claim 1 wherein the predistortion bounding controller modifies the predistortion values as a function of present and past values in a moving average sense in order to reduce random variations.

4. The linearizer of claim 1 wherein the predistortion bounding controller modifies predistortion values as a function of present and past values in a moving average to reduce random variations.

5. The linearizer of claim 1 wherein the predistortion bounding controller limits an amount by which predistortion values are changed.

6. The linearizer of claim 1 wherein the predistortion bounding controller stops an adaptive process or resets predistortion values to an initial or recently estimated suitable state.

7. A linearizer for a non-linear transmitter, the linearizer comprising:

a feedback receiver;

a gain regulator continuously adapted to be coupled to a non-linear transmitter;

an adaptive loop gain controller coupled to the gain regulator;

a loop gain bounding controller that receives feedback from a non-linear transmitter output and is coupled to control the gain regulator;

a predistorter adapted to be coupled to the non-linear transmitter;

a continuously adaptive predistortion controller coupled to the predistorter using continuously adapted predistortion values as a function of the feedback; and a predistortion bounding controller separately coupled to receive signals from each of the adaptive predistortion controller, the non-linear transmitter, and the feedback receiver to prevent unstable transmitter operation by providing predistortion control signals to provide limits on the predistorter and providing adaption control signals to the predistortion bounding controller to modify updating of the predistortion values, wherein at least one of the signals from the non-linear transmitter or the signals from the feedback receiver comprise a flag indicating saturation or overflow of an input to the non-linear transmitter or the feedback receiver, respectively.

8. The linearizer of claim 7 wherein the gain regulator is coupled to an output of the predistorter and directly coupleable to the non-linear transmitter.

9. The linearizer of claim 7 wherein the gain regulator is adapted to be coupled to the non-linear transmitter via the adaptive predistortion controller and predistorter.

10. The linearizer of claim 7 wherein the predistortion bounding controller limits a dynamic range of applied predistortion values and limits an amount by which predistortion values are changed via the predistortion controller.

11. The linearizer of claim 7 wherein the predistortion bounding controller modifies predistortion values as a function of present and past values in a moving average to reduce random variations.

12. The linearizer of claim 7 wherein the predistortion bounding controller limits an amount by which predistortion values are changed.

13. The linearizer of claim 7 wherein the predistortion bounding controller stops an adaptive process or resets predistortion values to an initial or recently estimated suitable state.

14. The linearizer of claim 7 wherein the loop gain bounding controller limits a dynamic range of gain values for the gain regulator.

15. The linearizer of claim 7 wherein the loop gain bounding controller limits a gain value update or change rate.

16. The linearizer of claim 7 wherein the loop gain bounding controller may stop gain regulation.

17. The linearizer of claim 7 wherein the loop gain bounding controller resets gain values to initial or recently estimated suitable values.

18. The linearizer of claim 7 and further comprising a non-linear transmitter and wherein the feedback receiver comprises a linear receiver that provides feedback to the gain regulator and adaptive predistortion controller.

19. The linearizer of claim 7 wherein the predistortion bounding controller is coupled to receive a power level of the input signal, a parametric control output of the adaptive predistortion controller, actual predistortion values used by the predistorter, indications of saturation or overflow of the predistorted signal in the transmitter, and indications of saturation or overflow of an output signal in a feedback receiver.

20. A method comprising:
obtaining feedback from signals transmitted by a non-linear transmitter;

predistorting an input signal for the non-linear transmitter using continuously adapted predistortion values as a function of the feedback;

bounding predistortion values used to predistort the input signal as a function of signals from the non-linear transmitter and as a function of signals from a linear receiver by providing predistortion control signals to control predistorting of the input signals and providing adaption control signals to modify updating of the predistorting of the input signals, wherein at least one of the signals from the non-linear transmitter or the signals from the linear receiver comprise a flag indicating saturation or overflow of an input to the non-linear transmitter or the linear receiver, respectively;

regulating gain applied to the input signal by use of continuously adapted gain regulation values and the feedback; and bounding the gain regulation values to limit loop gain as a function of adaptive loop parametric output to prevent unstable transmitter operation.

* * * * *